United States Patent
Aton et al.

(10) Patent No.: US 7,930,656 B2
(45) Date of Patent: Apr. 19, 2011

(54) SYSTEM AND METHOD FOR MAKING PHOTOMASKS

(75) Inventors: Thomas J. Aton, Dallas, TX (US); Carl A. Vickery, Garland, TX (US); Frank Scott Johnson, Richardson, TX (US); James Walter Blatchford, Richardson, TX (US); Benjamen Michael Rathsack, Austin, TX (US); Benjamin McKee, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 506 days.

(21) Appl. No.: 11/940,270

(22) Filed: Nov. 14, 2007

(65) Prior Publication Data

US 2009/0125865 A1   May 14, 2009

(51) Int. Cl.
*G06F 17/50* (2006.01)
(52) U.S. Cl. ............ 716/53; 716/50; 716/51; 716/52; 716/54; 716/56; 430/5; 430/30
(58) Field of Classification Search .......... 716/4, 19–21, 716/50–56, 111, 112; 430/5, 30
See application file for complete search history.

(56) References Cited

U.S. PATENT DOCUMENTS

| | | | |
|---|---|---|---|
| 6,764,795 B2 | 7/2004 | Aton et al. | |
| 7,315,641 B1 * | 1/2008 | Yoshikawa et al. | 382/144 |
| 7,669,153 B2 * | 2/2010 | Wu et al. | 716/5 |
| 2007/0105387 A1 * | 5/2007 | Blatchford et al. | 438/710 |

OTHER PUBLICATIONS

Aton, U.S. Appl. No. 11/771,515, filed Jun. 29, 2007.
Aton, U.S. Appl. No. 11/940,990, filed Nov. 15, 2007.
Aton et al., U.S. Appl. No. 11/940,016, filed Nov. 14, 2007.
Aton, U.S. Appl. No. 11/863,753, filed Sep. 28, 2007.
Aton et al., U.S. Appl. No. 11/940,194, filed Nov. 14, 2007.
Aton, U.S. Appl. No. 11/863,717, filed Sep. 28, 2007.
Aton et al., U.S. Appl. No. 11/940,245, filed Nov. 14, 2007.

* cited by examiner

*Primary Examiner* — Thuan Do
*Assistant Examiner* — Nha T Nguyen
(74) *Attorney, Agent, or Firm* — Warren L. Franz; Wade J. Brady, III; Frederick J. Telecky, Jr.

(57) ABSTRACT

The present disclosure is directed a method for preparing photomask patterns. The method comprises receiving drawn pattern data for a design database. The drawn pattern data describes first device features and second device features, the second device features being associated with design specifications for providing a desired connectivity of the first device features to the second device features. At least a first plurality of the first device features have drawn patterns that will not result in sufficient coverage to effect the desired connectivity. Photomask patterns are formed for the first device features, wherein the photomask patterns for the first plurality of the first device features will result in the desired coverage. Integrated circuit devices formed using the principles of the present disclosure are also taught.

11 Claims, 7 Drawing Sheets

SYSTEM AND METHOD FOR MAKING PHOTOMASKS

FIELD OF THE DISCLOSURE

The present application relates generally to the field of photolithography, and more specifically to a method and system for preparing a pattern for a photomask.

BACKGROUND OF THE DISCLOSURE

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a photomask, or "reticle", includes a semiconductor circuit layout pattern typically formed of opaque chrome, on a transparent glass (typically $SiO_2$) substrate. A stepper includes a light source and optics that project light coming through the photomask to image the circuit pattern, typically with a 4× to 5× reduction factor, on a photo-resist film formed on a wafer. The term "chrome" refers to an opaque masking material that is typically but not always comprised of chrome. The transmission of the opaque material may also vary such as in the case of an attenuating phase shift mask.

The process of making the photomask begins by receiving data from a design database. The design database contains data describing at least a portion of an integrated circuit design layout, referred to as the "drawn" pattern, which generally provides a target pattern that the designers wish to achieve on the wafer. Techniques for forming design databases are well known in the art.

After receiving the design database, mask makers form one or more photomasks that can be used to implement the target pattern described by the design data. This mask making process may generally include generating mask pattern data describing initial photomask patterns for forming device features. The initial photomask patterns are formed by employing various resolution enhancement techniques. The resolution enhancement techniques can include splitting the drawn pattern so that it is patterned using two or more photomasks, such as a phase shift mask and a trim mask, for use in a phase shift process (altPSM). Methods for forming phase and trim patterns from design data are well known in the art.

After the initial photomask patterns are formed, a proximity correction process is carried out that corrects the mask pattern data for proximity effects. The proximity correction process generally involves running proximity correction software to perform calculations that alter the shape of the initial photomask pattern to take into account proximity effects, such as optical diffraction effects that occur during the imaging process. In this method, a computer simulation program is often used to compute image-like model values that are taken to represent the features formed for a particular photomask feature pattern or group of patterns. Based on these simulated model values, the photomask pattern can be altered and then simulated again to determine if the altered pattern will improved the printed features. This process can be repeated until the result is with desired specifications. The features added to a photomask pattern based on this procedure are called optical proximity correction features.

As device features continue to shrink, it has become more and more difficult for mask makers to implement the target patterns contained in the design database. These difficulties are generally due to spatial bandwidth constraints of modern lithography systems, and the inherent difficulties associates with forming patterns approaching a nanometer scale (e.g., such as patterns having a critical dimension of 90 nm or less). In the past, these problems have been dealt with by setting appropriate design rules that designers can follow to form a design having target patterns that can be successfully implemented. However, the design rules have become increasingly complex, and often result in complicated patterns in the target design that are difficult or impossible to implement.

Given the overly complicated patterns formed by designers, mask makers are forced to redraw the target patterns to allow them to be implemented, while still maintaining the intended functionality of the circuit design. However, this can be a difficult and time consuming process due to the enormous amount of data that must be culled through by the mask makers. The overly complicated designs formed by the designers merely add to the confusion by making it difficult for the mask makers to determine the intended functionality of devices that must be redrawn. In addition, it is becoming more difficult to program the proximity correction software to successfully handle the complicated designs and produce photomask target patterns that will result in the desired target patterns set by the designers.

Some portions of an integrated circuit design are more complicated than other portions. For example, some memory devices, such as SRAM and DRAM devices can be formed by simply repeating small bit cells a large number of times. It has been found that SRAM and DRAM portions of a circuit can be formed without contact pads by precisely positioning contacts. Thus, gate structures for SRAM and DRAM portions of an integrated circuit are known to be formed without contact pads. These contacts are sometimes centered on a gate, but are sometimes also used to connect the gate to an active region by forming the contact to overlap an edge of the gate to thereby contact the active region.

Portions of semiconductor devices other than SRAM and DRAM, such as the logic portions of a device, are generally far more complicated. Attempting to specifically position contacts in a desired gate contact location without contact pads, as is done in SRAM and DRAM devices, would be very difficult given such complicated design layouts, and would also increase the amount of wafer real estate used to implement a design to allow for precise positioning of the contacts.

Accordingly, methods for simplifying circuit designs and/or allowing for a decrease in wafer real estate employed to make a given circuit would be a welcome addition in the art. Methods for more efficiently forming target patterns that can be implemented would also be desirable improvements, as would methods for improving the communication between circuit designers and mask makers regarding the intended functionality of circuit designs.

SUMMARY OF THE DISCLOSURE

In accordance with the disclosure, an embodiment of the present teachings is directed at a method for preparing photomask patterns. The method comprises receiving drawn pattern data for a design database. The drawn pattern data describes first device features and second device features, the second device features being associated with design specifications for providing a desired connectivity of the first device features to the second device features. At least a first plurality of the first device features have drawn patterns that will not result in sufficient coverage to effect the desired connectivity. Photomask patterns are formed for the first device features, wherein the photomask patterns for the first plurality of the first device features will result in the desired coverage.

Another embodiment of the present application is directed to a method for preparing photomask patterns. The method comprises receiving drawn pattern data from a design database, the drawn pattern data describing conductive device features and contacts. The contacts are associated with design specifications for providing a desired connectivity of the conductive device features to the contacts. At least a first plurality of the conductive device features have drawn patterns that will not result in sufficient coverage to effect the desired connectivity. Mask pattern data is generated describing photomask patterns for forming the conductive device features. A portion of the mask pattern data describes photomask patterns for the first plurality of conductive device features. A proximity correction process is performed to correct the first photomask pattern for proximity effects. At least one of the generating the mask pattern data or of performing the proximity correction process includes retargeting a portion of the mask pattern data describing the first plurality of conductive patterns to provide sufficient coverage to effect the desired connectivity.

Another embodiment of the present disclosure is directed to an integrated circuit device. The device comprises a substrate and a plurality of conductive device features formed over the substrate. The plurality of conductive features have one or more contact locations and a second region adjacent to the contact locations. The second region has a uniform width dimension. Each of the plurality of conductive device features comprises at least one contact location having a width that is substantially the same as the uniform width dimension. A plurality of contacts cover the contact locations. The plurality of contacts are located in a random logic portion of the integrated circuit.

Additional objects and embodiments of the disclosure will be set forth in part in the description which follows, and can be learned by practice of the disclosure. It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate several embodiments of the disclosure and, together with the description, serve to explain the principles of the disclosure.

DESCRIPTION OF THE EMBODIMENTS

Reference will now be made in detail to various exemplary embodiments of the present application, examples of which are illustrated in the accompanying drawings. Wherever possible, the same reference numbers will be used throughout the drawings to refer to the same or like parts.

The methods of the present teachings allow designers to draw simplified drawn patterns that do not necessarily include a desired target pattern for some device features. Desired target patterns for these drawn patterns can then be determined by retargeting the simplified drawn patterns downstream during the mask making process. As will be discussed in greater detail below, by moving the decision as to what the shape of the desired target pattern should be downstream, a more optimal solution can be found.

Figure 1:
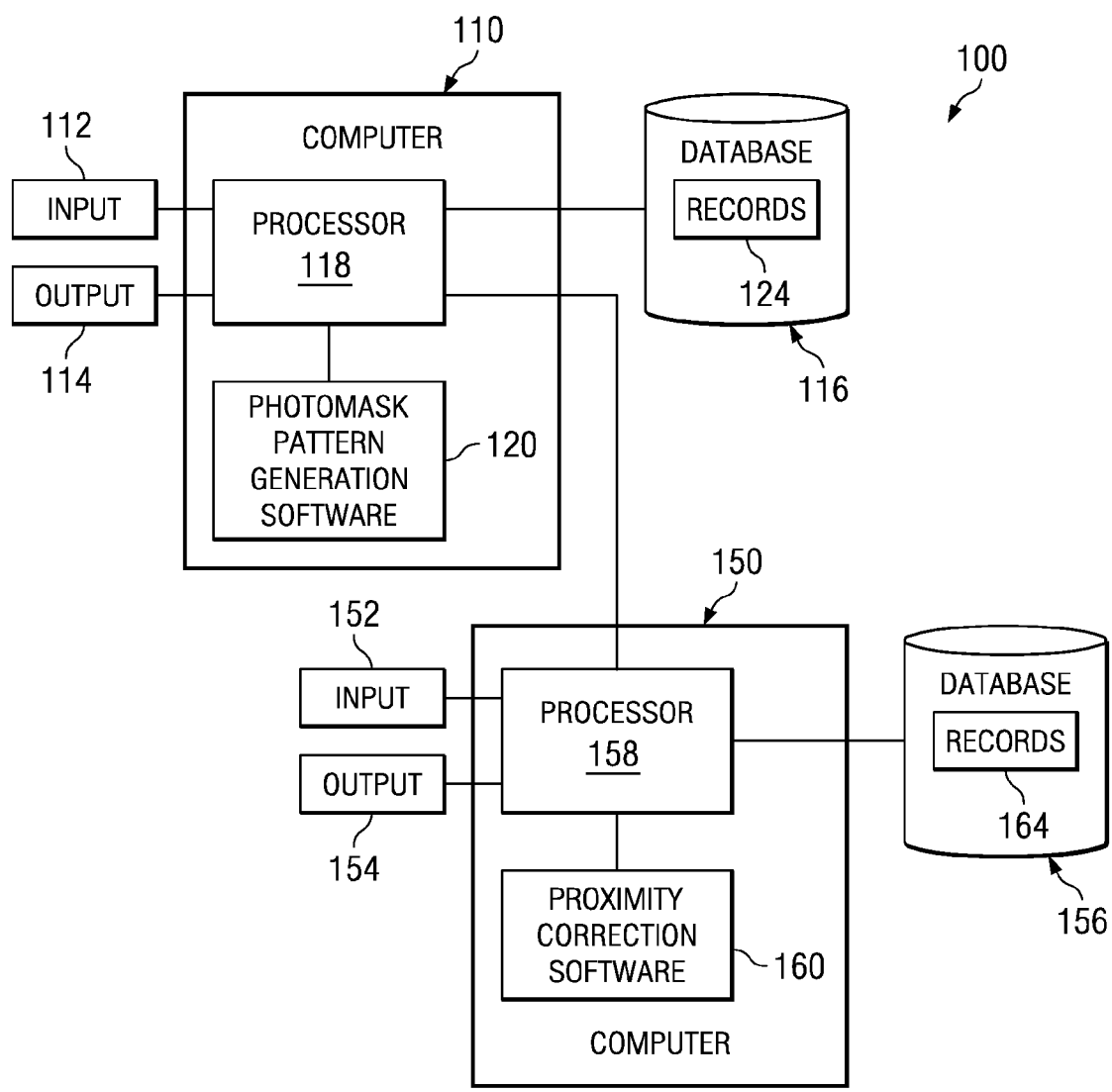
FIG. 1 illustrates a system for forming a photomask pattern, according to an embodiment of the present disclosure.

FIG. 1 illustrates a system 100 for forming a photomask pattern, according to an embodiment of the present disclosure. System 100 includes a first computer 110 and a second computer 150. Input devices 112, 152 and output devices 114, 154 are respectively coupled to computers 110 and 150, which are in turn respectively coupled to databases 116, 156, as shown in FIG. 1. Input devices 112, 152 may comprise, for example, a keyboard, a mouse, a network and/or any other device suitable for inputting and manipulating data to the respective computers 110 and 150. Output devices 114, 154 may comprise, for example, a display, a printer, and/or any other device suitable for presenting data from the respective computers 110 and 150.

Computers 110 and 150 can be personal computers, workstations, networked computers, or any other suitable processing platform. Computers 110 and 150 may include processors 118, 158, as shown in FIG. 1. The processor 118, 158 can be implemented using at least one microprocessor from vendors such as Intel, Advanced Micro Devices, Transmeta, IBM, or other circuit manufacturers. In addition, computer 110 can include photomask pattern generation software 120. Computer 150 can include proximity correction software 160.

Photomask pattern generation software 120 and proximity correction software 160 can exist as software that comprises program instructions in source code, object code, executable code or other formats; program instructions implemented in firmware; or hardware description language (HDL) files. Any of the above can be embodied on a computer readable medium, which include storage devices and signals, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes.

Processor 118 can be configured to control the flow of data between input device 112, output device 114, database 116, and photomask pattern generation software 120. Photomask pattern generation software 120 may receive descriptions of integrated circuit device features from database 116 and generate photomask patterns. A mask pattern database can be prepared, which can include mask pattern data generated by photomask pattern generation software 120. Once the mask pattern database is prepared, processor 118 can transfer the mask pattern database to computer 150 for further processing. The computers 110, 150 can be coupled together over a network (not shown). The network can be a local area network, a wide area network or a combination thereof. The communication protocol between the computers 110, 150 can be implemented with IEEE802.x, token ring, or any other network protocol.

Processor 158 of computer 150 can be configured to control the flow of data between input device 152, output device 154, database 156, and proximity correction software 160. Proximity correction software 160 can be configured to process the mask pattern data received from computer 150. Specifically, proximity correction software 160 performs a proximity correction process that corrects the mask pattern data for proximity effects. In addition, in some embodiments of the present disclosure, the proximity correction software can include software designed to retarget photomask patterns described by mask pattern data received from computer 150.

Databases 116, 156 may comprise any suitable system for storing data. Databases 116, 156 can be implemented using mask database technologies employing file formats such as GDSII or Oasis or any other suitable database formats. Database 116 can store records 124 (data or files) that comprise data associated with the integrated circuit device features and the photomask patterns to be generated, such as data from a design database and mask pattern database, as will be described in greater detail below. Database 156 may store records 164 (data or files) that comprise data associated with the proximity correction process, such as, for example, the mask pattern database transferred from computer 110.

Figure 2:
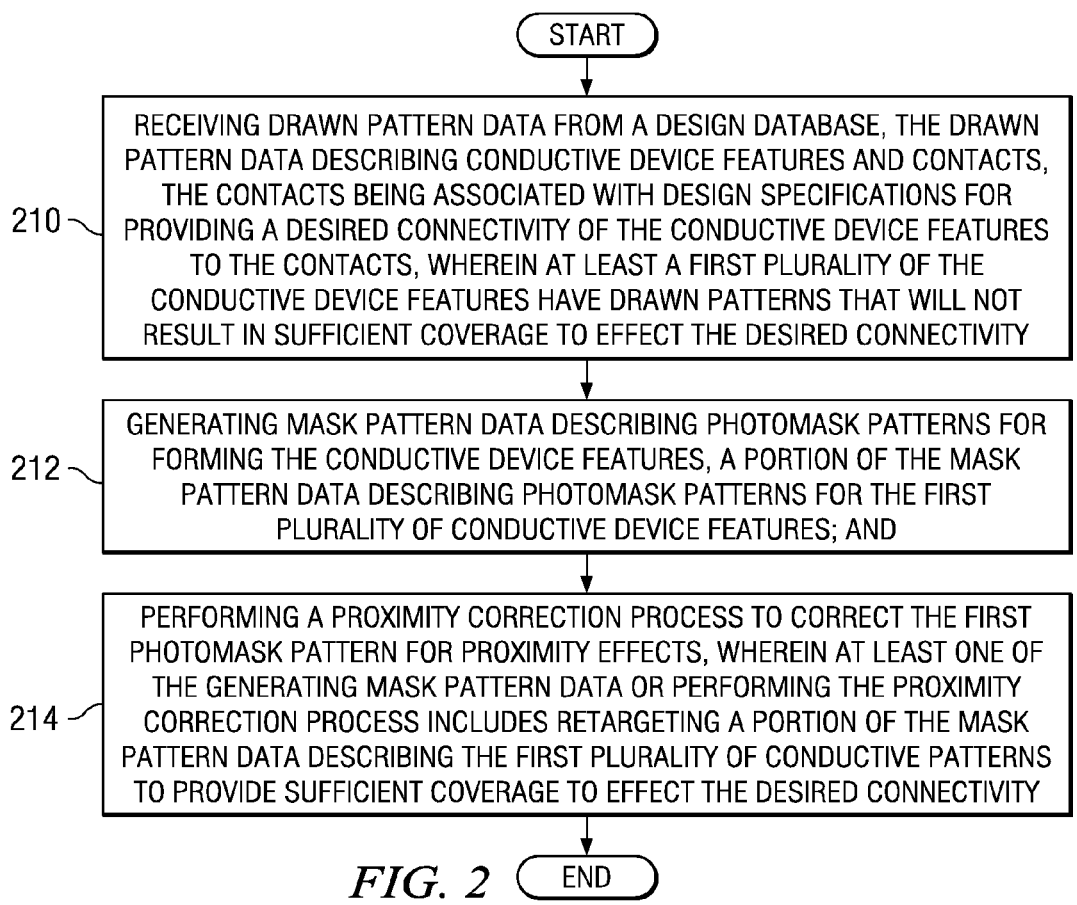
FIG. 2 illustrates a flow diagram of a process for making photomasks, according to an embodiment of the present disclosure.

FIG. 2 illustrates a flow diagram 200 of an embodiment of a process for making photomasks according to the present disclosure. It should be readily apparent to those of ordinary skill in the art that the flow diagram 200 depicted in FIG. 2 represents a generalized schematic illustration and that other steps may be added or existing steps may be removed or modified.

The process can include forming drawn pattern data (or as shown at 210 in the embodiment of FIG. 2, receiving the already formed drawn pattern data) for a design database. The drawn pattern data can describe drawn patterns of a plurality of device features for forming an integrated circuit. At least some of these drawn patterns will not include desired target patterns for the devices to be formed. In one embodiment, the drawn patterns include first device features and second device features. As illustrated at 210, the first device features can be conductive features, such as gates or wiring. The second device features can be, for example, contacts. The circuit design can dictate certain desired coverage specifications for the first and second device features which specify, for example, the amount of shared common area between the first and second device features in order to insure adequate connectivity (e.g., electrical conductivity) requirements are met. Adequate connectivity can be based, for example, upon the minimum connectivity requirements that are necessary to meet integrated circuit timing specifications set by the circuit designers, and can include safety margins to take into account any process and/or design uncertainties. However, at least a first portion of the first device features are drawn by the designers to have simplified drawn patterns that would not result in the desired coverage specifications being met if the drawn pattern was implemented.

The phrase "desired coverage" as used herein means to be in physical contact with a desired percent, or amount, of a surface area. Thus, the second device feature can be intended to physically contact a certain percentage of, or share a certain amount of common area with, a surface of the first device feature, so as to meet design specifications for the circuit. The desired percentage, or amount, of surface area to be covered can be any suitable amount, and can be determined, for example, by empirical methods.

After the design database is formed, it can be transferred to the mask makers. After receiving the design data, the mask makers use the data to make one or more photomasks for implementing the integrated circuit design described in the design database. As indicated in block 212 of FIG. 2, this mask making process may generally include generating mask pattern data describing initial photomask patterns for forming device features. The generation of the mask pattern data can be done by the photomask pattern generation software 120 of FIG. 1, which outputs an initial photomask pattern.

The initial photomask patterns are formed by employing various resolution enhancement techniques, which can be programmed into the photomask pattern generation software 120 and executed by the processor 118. In some embodiments, the resolution enhancement techniques may include redrawing portions of the drawn pattern. For example, in some instances it may be determined that the drawn pattern may be difficult or impossible to pattern given the constraints of the lithography system being employed. In such instances, it may be desirable to redraw the design data pattern to account for these lithography restraints, while achieving the basic circuit functionality intended by the drawn pattern.

The resolution enhancement techniques can also include splitting the drawn pattern so that it is patterned using two or more photomasks. Suitable examples of photomask systems for splitting the drawn pattern include a system comprising a phase shift mask and a trim mask, for use in a phase shift process (altPSM), as mentioned above. Other examples, can include two embedded attenuated phase shift masks, or two or more of any of the other mask types that are taught herein. Methods for forming such mask system patterns from design data are well known in the art, and any suitable method for forming such masks may be employed. For example, phase and trim patterns can be generated using software programs designed to read data from the design database and prepare appropriate patterns for forming the masks used to make the integrated circuit designs described in the database. One example of a suitable software program is IN-PHASE, which is available from SYNOPSYS, Inc., having corporate headquarters located in Mountain View, Calif.

Yet another example of resolution enhancement techniques for forming the initial photomask patterns may include the formation of sub-resolution assist features (SRAFs). Techniques for forming SRAFs are well known in the art.

The shape of the initial photomask pattern may generally reflect a mask target pattern. The mask target pattern may be different than the target pattern described in the design database due to alterations made by the mask makers to account for such things as limitations of the lithography system, as described herein. Further, the initial photomask pattern can also include other pattern features not intended to be formed on the wafer, such as SRAFs.

The term "target pattern" is defined herein as a desired shape of the pattern to be formed on the substrate (e.g., the wafer in semiconductor processing). As one of ordinary skill in the art would readily understand, the target pattern is not necessarily identical to the pattern formed on the photomask, or for that matter, the pattern that is actually realized on the substrate. Differences between the target pattern and the photomask pattern can be due, at least in part, to various changes made to the mask pattern during processing, such as optical proximity corrections, which allow the target pattern to be more closely achieved on the substrate. Differences between the target patterns and the patterns finally formed on the wafer can be due to various photolithographic and etching process imperfections, for example.

The initial photomask pattern data can be included in a mask pattern database. The mask pattern database can also include other data, in addition to the mask pattern data, that is relevant to the proximity correction process that is subsequently carried out in block 214 of FIG. 2. In some embodiments of the present disclosure, this other set of data can comprise information about second device features. For example, this second set of data can include data for describing adjacent biasing layers, such as the location of contacts on the first device feature, as will be described in greater detail below. Additional description regarding the function and potential techniques for employing mask pattern database preparation software in relation to processes of the present application is described in copending U.S. application Ser. No. 11/940,194, entitled SYSTEM AND METHOD FOR MAKING PHOTOMASKS, filed Nov. 14, 2007, in the name of Thomas J. Aton et al., the description of which is hereby incorporated by reference in its entirety.

In order to more closely achieve the desired mask target pattern, the initial photomask pattern of block 212 is corrected for proximity effects in a proximity correction process, such as is shown in block 214. The proximity correction process generally involves implementing proximity correction software that performs calculations that alter the shape of the initial photomask pattern to take into account proximity effects, such as optical diffraction effects that occur during the imaging process. Any suitable technique for correcting for proximity effects may be employed. One example of a known proximity correction process is disclosed in U.S. Pat. No. 6,764,795, issued on Jul. 20, 2004, to Aton et al., the disclosure of which is herein incorporated by reference in its entirety.

In addition to adjusting for proximity effects, the proximity correction software can also be programmed to alter the target pattern. Such alterations may be referred to as "retargeting". By the term "retargeting," it is meant that the proximity correction software can be programmed to, in effect, set a new target pattern for the mask pattern. For example, where the second device features described in the design database are intended by the designers to provide a desired coverage of the first device features, the proximity correction software can be programmed to, under certain circumstances, retarget the mask patterns so that they no longer reflect the simplified drawn patterns that do not provide the desired coverage, but instead reflect altered target patterns that will provide the desired coverage.

After correction of the initial photomask pattern for optical proximity effects in block 214, the mask pattern data can be put through a verification process to insure that it meets desired quality standards, and is otherwise prepared for manufacturing, or writing, of the photomask. For example, the mask pattern data may be fractured, which puts the data in a form which is compatible with the mask writing process. The data fracture process may be accomplished using any suitable software program. One example of a suitable software program known in the art for mask data fracturing is CATS, which is available from SYNOPSYS, Inc.

Once the preparation of the mask data is complete, the data can then be used to write the photomasks. Often the mask pattern data is sent to a mask shop, where actual production of the photomasks occurs. Any suitable technique for writing the photomask may be employed. Suitable techniques for writing masks are well known in the art.

In one embodiment, the processes of preparing the design database of block 210, generating the mask pattern data of block 212 and performing the proximity correction process of block 214 can be performed on separate computers. In other embodiments, one or more of the process depicted in FIG. 2 can be performed on a single computer. For example, in one embodiment, the processes of generating the mask pattern data and performing proximity correction can be performed on the same computer.

The process of FIG. 2 may be employed for making any type of photomasks, including phase shift masks and trim masks for use in a phase shift process (altPSM), binary masks, embedded attenuated phase shift masks, hard phase shift masks, double-dipole exposure masks, or any other suitable type of mask. The embodiments of the present application are not intended to be limited to the processes illustrated in FIG. 2, and other additional processes, such as data verification procedures, which are not shown in the flow diagram of FIG. 2, may also be employed.

Figure 3:
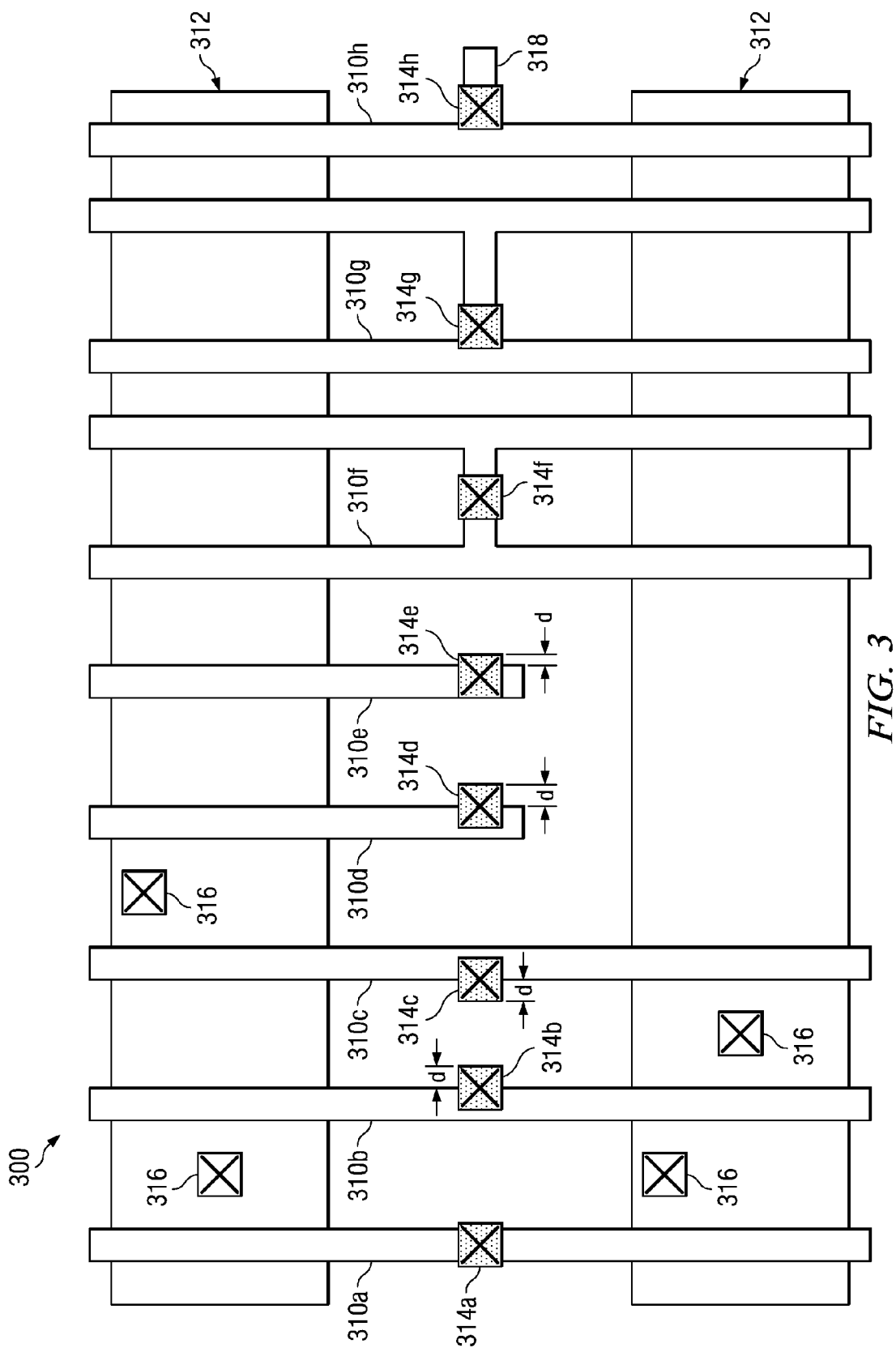
FIG. 3 illustrates a drawn circuit layout pattern, according to an embodiment of the present disclosure.

FIG. 3 illustrates one example of a drawn circuit layout pattern 300, as might be formed at block 210 of FIG. 2, according to an embodiment of the present application. The circuit layout includes device features that are conductive layer patterns. In an illustrative exemplary embodiment, the device features can be gate structure patterns 310a to 310h formed over active region patterns 312. The layout 300 includes pattern information regarding second device features formed adjacent to gate structure patterns 310, such as contacts 314a to 314h, which are positioned on corresponding gate structures 310a to 310h, as shown. Layout 300 also includes contact locations 316 that are not positioned on the gate structure, but instead are positioned on active region patterns 312. As discussed above, data describing such circuit layout patterns can be stored in the design database. In this embodiment, gate structures 310 of FIG. 3 are simplified in that the drawn patterns are formed so as not to fully "cover" or enclose the second device features, here illustrated by the contact rectangles 314a to 314h.

Figure 4:
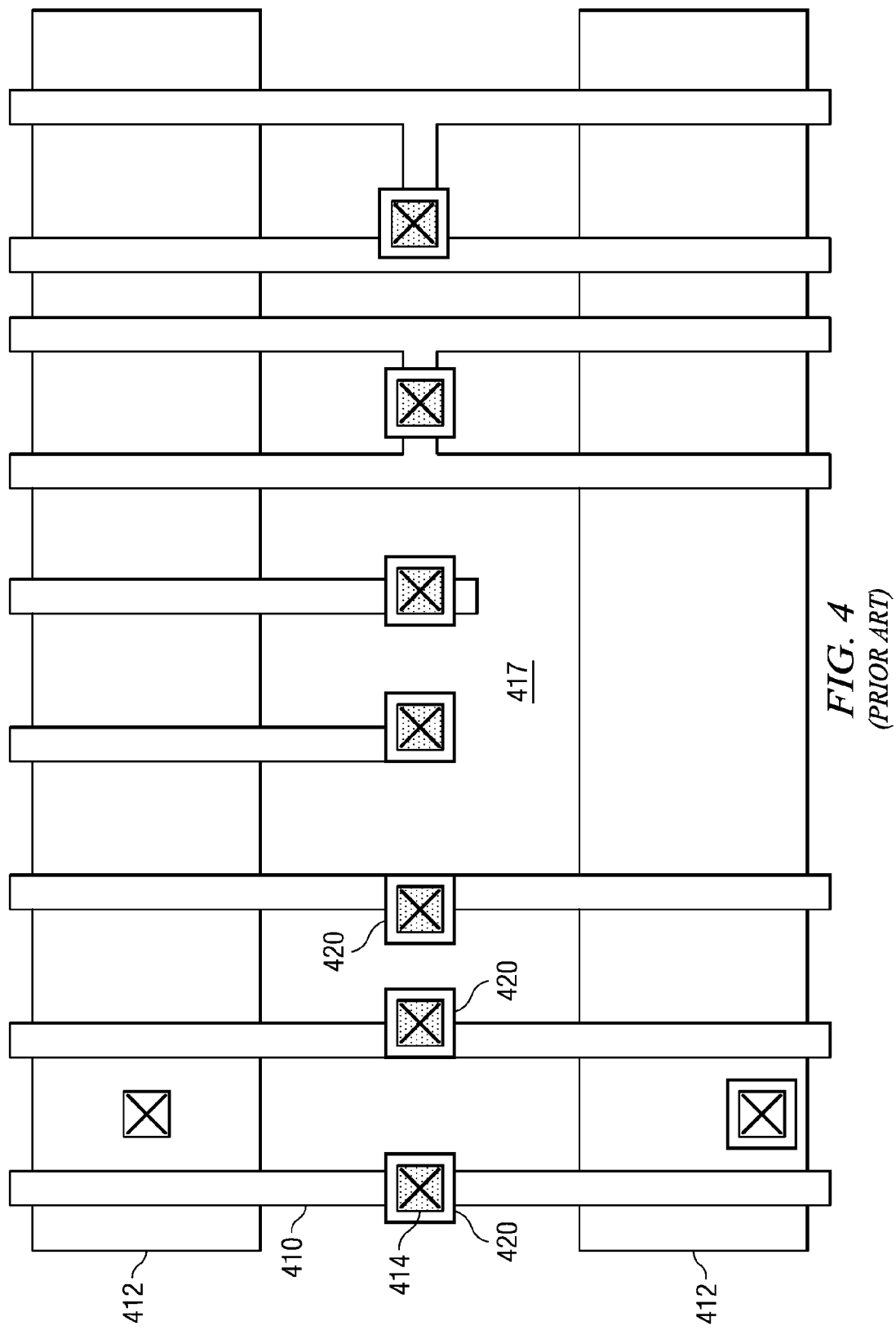
FIG. 4 illustrates a conventional drawn gate circuit layout with contact pads.

In conventionally drawn gate circuit layouts, such as shown in FIG. 4, the gate layers are always drawn to enclose the contact layer features. That is, "contact pads" 420 are drawn at desired contact locations as part of the gate structure patterns 410 that differ significantly in shape from the long straight parts of the gate pattern that form the transistors over active. These contact pads are conventionally added as a mechanism to provide sufficient overlap between the gate structure 410 and the contacts 414 to insure sufficient electrical conductivity and maintain low resistance between the contact and device features, such as gate structures or active regions of the device. Such "contact pads" have also been conventionally drawn in fine-line metal patterns to insure sufficient electrical contact between those metal patterns and higher level metallization structures, for example.

The term "contact" is sometimes referred to in the art as being limited to electrical connecting structures between metal 1 and the device structures formed on the wafer (e.g., contacts made from metal 1 to gates or active regions). However, for purposes of this disclosure, the term "contact" is defined to include any electrical connection made between upper and lower levels of a device, including contacts formed between metal 1 and the device structures on the wafer, as well as metal to metal contacts formed between upper level metallization structures (often referred to as vias or via fill). The contacts can comprise any suitable electrical conducting material, such as doped polysilicon or metal.

In the gate-contact layer pair illustration of FIG. 3, it has been found that such contact pads are not always necessary to provide the necessary coverage to provide sufficiently low resistance between the contact and the gate structures. For example, where a contact has sufficient common area with a gate structure, such as in the case of contacts 314*a*, 314*f*, and 314*g* shown in FIG. 3, sufficient shared surface area at the contact-gate interface can exist to provide an acceptably low resistance. The gate structures 310 that are formed without contact pads are easier to draw than gate structures with contact pads and are more easily implemented given the constraints of modern lithography systems. For example, the gate structures underlying contact 314*a* can be patterned with straight edges, significantly simplifying proximity correction in the region around contact 314*a* relative to what would be necessary for proximity correction around contacts 420.

Design constraints, however, require that some contacts must be offset from the "straight line" gate of contact 314*a* if the necessary contact and metal connections to all gate features are to be compactly achieved. Such contacts cannot always have sufficient common area to gate so as to provide the desired coverage. For example, contacts 314*b*, 314*c*, 314*d* and 314*e* of FIG. 3 are shown to have a relatively large overhang distance, d, off of the gate structures 310, which in one embodiment can be a method of detecting insufficient common area between the gate and contact layers. The reduced coverage area may result in unacceptably high resistance between the contact and gate structure if the drawn patterns illustrated here are strictly implemented on the final electrical circuit as manufactured (that is, "on the wafer" or "in silicon" as commonly referred to in the art). The term "sufficient common area," as used herein, means that the area of the contact overlapping or common to polygons representing the conductive device features is sufficiently large as to achieve a desired object, such as providing a desired degree of electrical contact and/or reduced resistance, once these polygons have been used to produce a working electrical device, as discussed above.

Further, as discussed above, drawing an even-minimally-desirable set of contact pads can be a difficult task for designers, requiring generation of complex design rules that the designer must try to follow to allow for the limitations of the lithographic and proximity correction systems. It is commonly found in practice that designers often choose poorly shaped polygons, difficult to pattern on the wafer, because they lack detailed knowledge of lithographic considerations. A better solution is for the designers to draw the gate structures without contact pads where plausible, even where a sufficient contact-gate overlap is important to good electrical behavior. The shape of the most desirable coverage patterns can then be determined downstream, during the mask making process, where more complete lithographic knowledge and simulation capability is available.

Thus, the drawn patterns of FIG. 3 do not provide a desired target pattern for the portion of the gate structures where it is determined that sufficient coverage is not provided by the drawn pattern, such as is the case for gate structures 314*b*, 314*c*, 314*d* and 314*e*. The drawn patterns can, however, convey sufficient information to the downstream mask-making system to indicate the desired electrical connectivity. The best shapes for altering the target patterns can then subsequently be determined during the mask making process.

In some embodiments, a desired contact may have so little common area with the gate structure that it may be difficult for the downstream process to form a covering shape that will provide sufficient coverage. Thus, in some embodiments, where contacts are to be formed to have a certain minimal overlap area, the mask makers may be required to draw an extension to the gate structure that provides desired coverage.

Any suitable minimal overlap area can be chosen based on lithography process and associated difficulty for redrawing a relatively large covering shape. For example, the desired minimal coverage area can be chosen to be about 30% or less, such as about 20% or about 10% or less, of the coverage that would be achieved if the contact were centered on the associated minimum-width gate structure. For example, contact 314*h* is formed with a minimal overlap of the main gate structure 310*h*. In this situation, an extension 318 of the gate structure can be drawn to increase the coverage between the underlying gate structure and contact 314*h*. In some embodiments, contact 314*h* can be substantially covered by extension 318. In addition, in some embodiments, extension 318 can extend past the end of contact 314*h*, as shown in FIG. 3.

Figure 5:
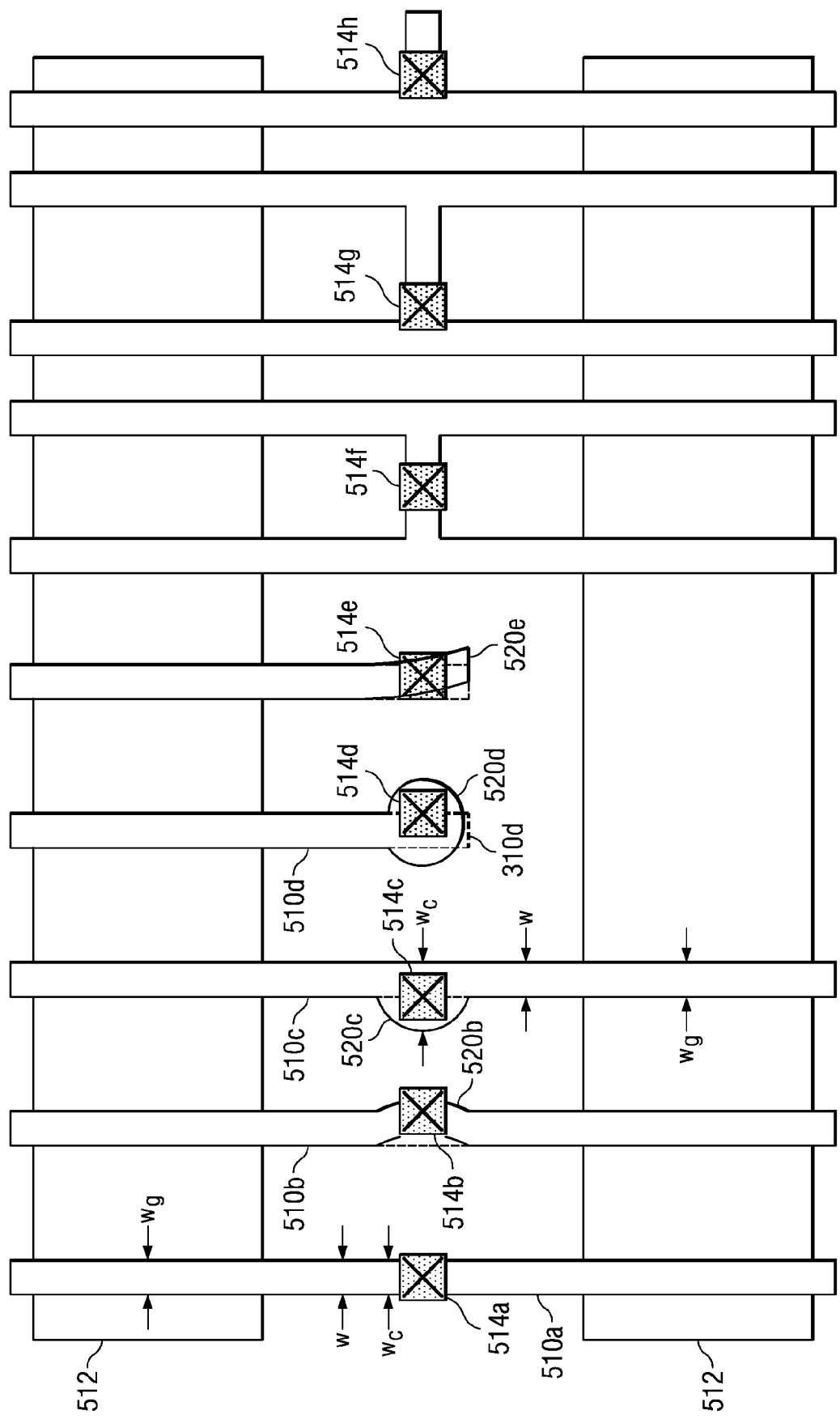
FIG. 5 shows examples of altered target patterns, according to an embodiment of the present disclosure.

During the mask making process, the gate structure patterns 310*b*, 310*c*, 310*d* and 310*e* of FIG. 3 can be retargeted to generate sufficient contact common area. FIG. 5 shows examples of the altered target patterns, which are illustrated as gate structures 510*b*, 510*c*, 510*d* and 510*e*. Gate structures 510*b*, 510*c*, 510*d* and 510*e* include modified common areas 520*b*, 520*c*, 520*d* and 520*e*, which provide the desired coverage of the corresponding contacts 514*b*, 514*c*, 514*d* and 514*e*. The altered target patterns may be formed to provide any suitable amount of coverage. For example, the altered target pattern for gate structure 520*b* provides partial coverage of contact 514*b*, while the altered target patterns for gate structures 520*c* and 520*d* provide complete coverage of corresponding contacts 514*c* and 514*d*. The desired amount of coverage provided can be set, for example, by rule; and can be determined by empirical methods. In one embodiment, the desired coverage can be set as a percentage of the coverage that would be achieved if the contact were centered on the associated gate structure. Any suitable percentage can be chosen as the desired coverage. For example, the desired coverage can be chosen to be about 50% or greater, such as about 65% or about 75% or greater, of the coverage that would be achieved if the contact were centered on the associated gate structure at a contact location having a chosen uniform width dimension, "w", for the portion of the gate structure formed over field regions (as opposed to active regions) of the device. Design rules can be set to prevent designs from containing partially covered contacts were the required modifications by the mask making system would be too large, risking insufficient coverage or shorting between conductive features if large modifications were made.

In embodiments, the uniform width dimension "w" for a gate can be the same or different than the gate length for the gate structure formed over active. In an embodiment, the width dimension "w" is approximately the same as the gate length as formed over active, wherein "approximately the same" is defined herein to mean within about 15% of the gate length (e.g., no more than about 15% longer than the gate length).

Figure 6A:
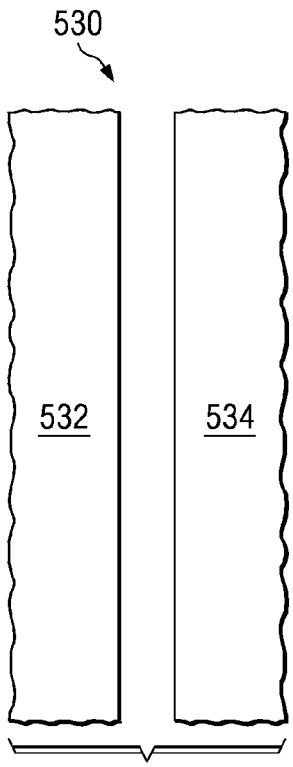
FIGS. 6A and 6B illustrate phase patterns before and after retargeting, respectively, according to an embodiment of the present disclosure.

The altered shape of the target pattern can be determined at any suitable point downstream of the formation of the drawn pattern. In one embodiment, the final target pattern is determined during the proximity correction process, where at least a portion of the retargeting can occur. In this embodiment, the drawn circuit layout 300 can be used to generate mask pattern data, as described above in block 212 of FIG. 2. For example, mask pattern data can be generated that describe initial photomask patterns, such as phase patterns and trim patterns. One example of an initial phase pattern 530 for implementing a gate structure is illustrated in FIG. 6A. In this embodiment, initial phase pattern 530 can reflect a target pattern as established by the drawn data. For purposes of illustration, initial phase pattern 530 of FIG. 6A reflects a target pattern for drawn gate structure 310c of FIG. 3.

A proximity correction process can then be carried out to correct the initial photomask patterns for proximity effects. Proximity correction is generally well known, and can include, for example, positioning individual segments of the initial photomask pattern to adjust for optical diffraction of light from patterns proximate to the feature, as well as to adjust for etch effects and other phenomenon that might affect the final pattern that is formed on the wafer.

Figure 6B:
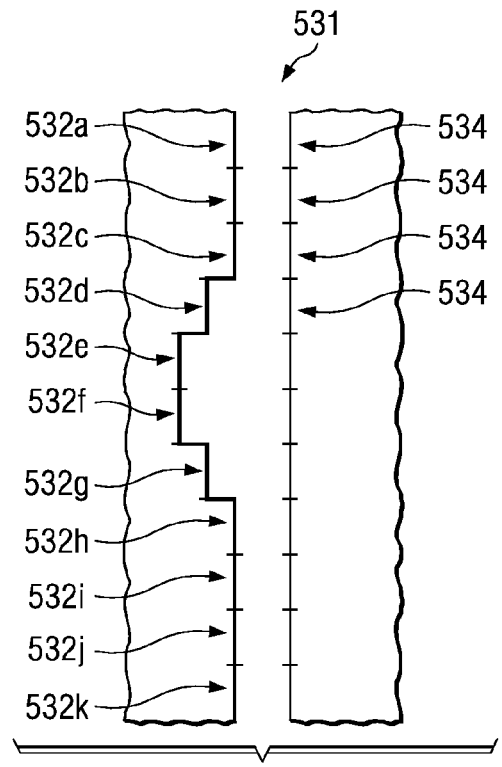

In the processes of the present disclosure, the proximity correction process can further include retargeting the initial photomask pattern to provide the desired coverage. FIG. 6B illustrates one example of a portion of a retargeted phase pattern 531 after proximity correction process has been carried out. For illustrative purposes, phase pattern 531 reflects the portion of altered target pattern of gate structure 510c (shown in FIG. 5) that includes contact overlap region 520c. As illustrated, segments 532d, 532e, 532f, and 532g of the corrected phase pattern have been adjusted by moving the inner edges to increase the size of the pattern in the region corresponding to contact overlap region 520c.

The edges of the initial target patterns 310 of FIG. 3 can be adjusted in any suitable manner to form any desired contact pad shapes and thereby increase common area to be shared with the contact. In the above example showing retargeted gate structure 510c, only a single edge of the initial mask pattern was adjusted outward during the retargeting process. However, more than one edge of a pattern can be retargeted. For example, as apparent from the altered target pattern for gate structure 510d of FIG. 5, both longitudinal edges of the initial gate pattern 310d, illustrated by the dashed lines, have been adjusted outward to increase the surface area of the contact location 520d and thereby increase common area to be shared with the contact. In overlap region 520b and 520e, one longitudinal edge of the initial gate patterns 310b and 310e have been adjusted outward from their initial shape to increase coverage, but the other longitudinal edge has been adjusted inward in order to approximately maintain the originally drawn width target of 310b and 310e while "moving" it under the contact region. In this manner the gate structures 510b and 510e are "bent" so as to more closely center the contact on the contact location and thereby increase the common area shared with the contact.

The shape of the altered target pattern for contact regions 520 can be a function of, for example, the desired coverage to be achieved, the bandwidth of the lithography system, and the instructions programmed into the proximity correction software. Given the teachings of the present disclosure, developing the computer code for implementing the proximity correction and retargeting processes can be accomplished by one of ordinary skill in the art without undue experimentation once the desirable shapes have been determined that match lithographic and other manufacturing considerations.

Determining which gate structures of the drawn pattern are to be retargeted can be performed in any suitable manner. In one embodiment, the proximity correction software can be programmed to determine which contacts do not provide the desired coverage of the associated gate structures. Whether the desired coverage is achieved by the drawn pattern may be ascertained by any suitable technique. One suitable technique can include determining whether contact locations overhang along a lateral dimension of the conductive device features (as shown in FIG. 3) by a selected amount "d". Any contact that overhangs greater than a selected amount "d" is considered not to provide the desired coverage. The selected overhang amount "d" may vary by location within the design depending on any desired characteristic of the drawn or manufactured shapes. Non-limiting values for "d" can range from 2 nm to 100 nm, such as 5 nm, 10 nm 20 nm, or 30 nm, although values outside of the disclosed range can also be used. The value for "d" can also be based upon a desired percentage of a width dimension, such as a chosen uniform width dimension for the particular device feature in question (e.g., width chosen for portions of a gate formed over field regions), or the critical dimension for a device feature (e.g., gate length of the portion of a gate structure formed over active). Suitable non-limiting values include about 10% to about 70% of a chosen uniform width dimension, such as 10% or 20%, although values outside of this non-limiting range can also be chosen. Another suitable technique can include determining whether a certain percentage of the gate structure is covered by an associated contact in the drawn pattern, as described above. Mask patterns for gate structures that are determined not to result in the desired coverage can be retargeted to form an altered target pattern; and the mask patterns for the remaining gate structure patterns can be formed to reflect, for example, the initial mask target patterns. The process for determining which gate structures are to be retargeted can occur at any suitable time in the mask making process, or alternatively could occur upstream during the design of the drawn data.

In an alternative embodiment to the process shown in FIG. 2, the retargeting process can occur prior to proximity correction, such as during the block 212 process of generating the initial mask pattern data. For example, the software used to generate the initial photomask patterns from the drawn pattern (corresponding to software 120 of FIG. 1), could be programmed to retarget the drawn pattern data of FIG. 3, so that the initial photomask patterns reflect an altered target pattern, such as shown in FIG. 5. Methods similar to those described above for determining which gate structures 310 are to be retargeted and what shape the altered target patterns are to have can be employed. The proximity correction process can then be carried out on the initial photomask patterns. In an alternative embodiment, a portion of the gate structures can be retargeted during the generation of the initial mask pattern; and the remaining gate structures that are to be retargeted can be retargeted during the proximity correction process.

Figure 7A:
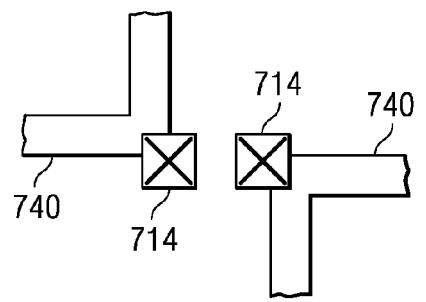
FIGS. 7A to 7C illustrate certain principles with respect to drawn patterns having device corner features, according to an embodiment of the present disclosure.

It has been determined that there are some scenarios where there may not be sufficient room on the mask to provide the desired coverage if retargeting is required. For example, FIG. 7A illustrates a drawn pattern having device corner features 740, which can be, for example, device wiring or gate structures. Contact patterns 714 have sufficiently large overhang of the corner features 740 so as to require retargeting during the mask making process, such as, for example, during a subsequent proximity correction process.

Figure 7B:
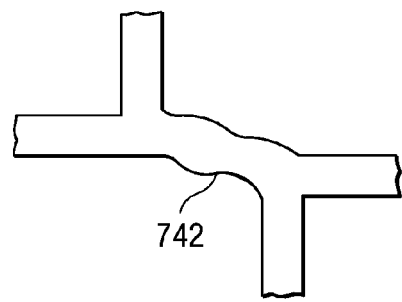

Forming mask patterns for implementing corner features for nanometer scale patterns can be difficult due to the spatial bandwidth required to turn a right angle in such as small space. This can make retargeting to provide a target pattern that can be implemented in the area of a corner feature difficult or impossible for the proximity correction process. For example, FIG. 7B illustrates one potential hazard where retargeting near two adjacent corner features 740 can result in a short 742 between those corner features.

Figure 7C:
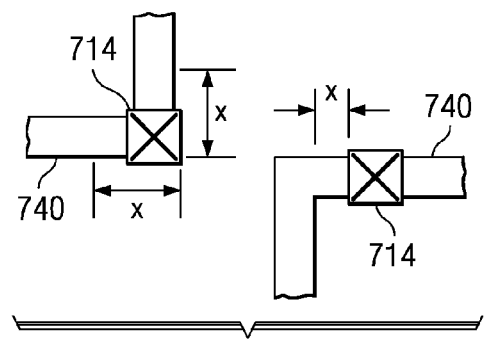

Design rules can be implemented that reduce the likelihood that such potential problems will be realized. One such exemplary rule can be that designers are required to use sufficiently small overhang for contacts within a chosen distance x of the corner, as illustrated in FIG. 7C, so that retargeting to form a coverage region is not required to provide sufficient coverage between contact 714 and corner feature 740. The distance "x"

can be to either inside or outside corner features. In some embodiments, the distance "x" to inside corner features can also be different from the rule distance to outside corner features. The distance "x" can be any desired distance, such as, for example, 50 nm or 100 nm or less. Another exemplary rule can be that corner features not be positioned within a certain distance of other device features where there is a potential for shorting or other problems.

The processes of the present application are not limited to mask data for correcting gate structure patterns, as in the above examples of FIGS. 3 to 5, but could also be employed for forming other mask pattern features. For example, FIGS. 8A and 8B illustrate a metal wiring pattern 810 having one or more contacts, that electrically connect the metal wiring pattern to other levels of the integrated circuit.

Figure 8A:
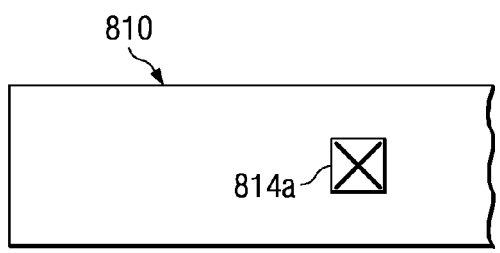
FIGS. 8A and 8B illustrate target patterns for metal wiring, according to embodiments of the present disclosure.
Figure 8B:
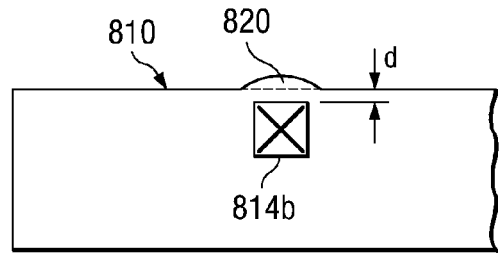

In cases where the contact 814 is sufficiently covered by the metal wiring pattern 810 to provide a desired coverage, as illustrated in FIG. 8A, the target pattern provided by the drawn pattern data may be sufficient, and thus it can be determined that no retargeting downstream is to be carried out. In cases where the contact 814 is not sufficiently centered on the metal wiring pattern 810 to provide a desired coverage, as illustrated in FIG. 8B, it may be determined that retargeting is to be carried out to form a covering region 820. For example, if contact 814b either overhangs the edge or is closer than a distance "d" to the edge of metal pattern 810, coverage may need to be increased by retargeting the edge of 810. The shape of the metal pattern 810 can be retargeted in any manner in order to increase coverage, including by altering the shapes of the metal line patterns in any of the same manners illustrated in FIG. 5 for altering gate structure patterns. Similarly as described above with respect to FIGS. 3 to 5, the retargeting process can occur at any suitable point downstream of the formation of the drawn pattern data. For example, retargeting can occur during the generation of the initial mask pattern or during the proximity correction process. In some embodiments, a portion of the device patterns to be retargeted can be retargeted during the generation of the initial mask pattern, and the remaining portion to be retargeted can be retargeted during the proximity correction process.

Any suitable method for determining which contacts are sufficiently covered in the drawn pattern may be employed. In some embodiments, contacts 814 that are sufficiently centered on the metal wiring pattern can be determined to provide sufficient coverage. In some embodiments, it may be desirable that the contacts are completely covered by the metal wiring. Thus, for example, the contacts may be determined to be sufficiently covered if they are within a sufficient distance of an edge of the metal wiring to insure complete coverage given mask misalignment tolerances.

Figure 9:
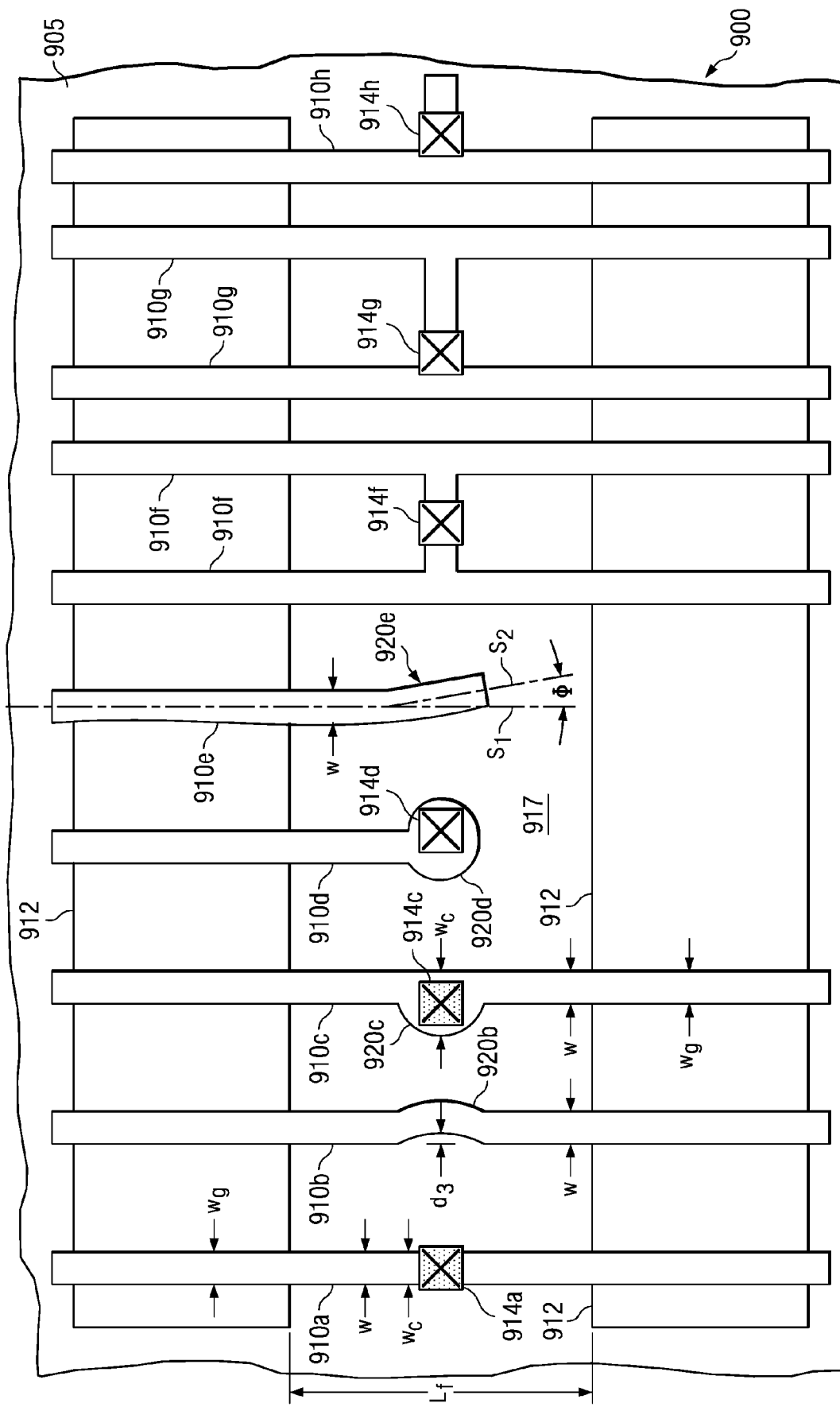
FIG. 9 illustrates a portion of an integrated circuit device fabricated using the altered target pattern layout of FIG. 5, according to an embodiment of the present disclosure.

The present application is also directed to integrated circuit devices formed using the photomask patterns of the present disclosure. Integrated circuits can include devices realized by the implementation of the retargeted target patterns, such as the patterns illustrated in FIG. 5, FIG. 7C, and FIGS. 8A and 8B. One of ordinary skill in the art would readily understand how to implement any of these patterns using suitable device fabrication techniques. FIG. 9 illustrates an example of a portion of an integrated circuit device 900, which corresponds to the altered target pattern layout of FIG. 5. For illustrative purposes, the integrated circuit 900 is shown as being substantially identical to the pattern layout of FIG. 5. However, due at least in part to process imperfections, the patterns formed on the integrated circuits would not likely be identical to the target patterns illustrated. As is well known in the art, the integrated circuit can include a substrate 905 comprising semiconductor, glass or other materials known in the art for forming integrated circuits. A plurality of device features can be formed over the substrate, including active regions 912, isolation regions (not shown), insulative layers (also not shown), etc, as is well known in the art. Gate features 910 of FIG. 9 can be formed over the substrate. Gate features 910 can be any suitable gate structure formed by any suitable method. For example, gate features 910 can be a MOS gate comprising, for example, polysilicon and/or metal, as is well known in the art.

In an embodiment, each of the plurality of conductive device features can comprise at least one contact location. A plurality of contacts, such as contacts 914 of FIG. 9, can be positioned to cover the contact locations on the first conductive features. For illustrated purposes only, contacts are not shown for gates 910b and 910e, although such gates would be formed during fabrication. A first plurality of the conductive device features, such as gate structures 910b, 910c, 910d and 910e do comprise a contact coverage region at the contact location. The term "coverage region" is defined herein to mean a region of the device feature that has been altered relative to drawn to increase coverage, where the drawn pattern has been formed without contact pad patterns, as described above.

A second plurality of the conductive device features, such as gate structures 910a, 910f, 910g, and 910h of FIG. 5, do not comprise a contact coverage region at the at least one contact location. Any percentage of the contact locations can be formed without coverage regions. For example, 10% or 50% or more of the contacts to the gate features can be formed without coverage regions. In some embodiments, all or about all (e.g., greater than 90%) of the contacts to the gate features do not comprise contact coverage regions.

The resulting shapes of the coverage regions realized on the integrated circuit device can be any desired shape that will increase common area with the contacts, including any of the shapes described above with respect to FIG. 5 and shown implemented in the device of FIG. 9. For example, single or multiple edges of a gate or metal pattern can be shifted outward to form a bulged out region that increases the surface area of the contact location, as in contact regions 920c and 920d. In embodiments, gate structures can also be "bent" so as to more closely center the contact on the contact location and thereby increase the common area shared with the contact, while in some embodiments, still substantially maintaining the uniform width dimension, "w", of the device feature throughout the contact region, as shown in 920b and 920e of FIG. 9.

The first plurality and second plurality of the gate structures are formed to have a lateral dimension, $w_c$, at the contact locations, for gate structured 910a and 910c of FIG. 9 ($w_c$ is shown in both FIGS. 5 and 9 as being the width of the gate structures 510a and 910a that is next to the contact for illustrative purposes only, and is meant to be the actual width at the contact location). The size of $w_c$ at the contact locations having coverage regions with increased surface area can be greater than a uniform width dimension "w", of the gate structure formed over the field region 917. The dimension "$w_c$" can be increased by any amount relative to "w", such as by about a 10% to about a 200% increase or more, such as, by 20%, 30%, 50%, or 100%.

In instances where coverage regions are not formed, the size of $w_c$ at the contact locations of the second plurality can be substantially the same as the uniform width dimension, w, of the particular device features on which the contact locations are located. In the case of bent patterns 910b and 910e, $w_c$ can be greater than, less than or the same as "w", as long as desired coverage requirements are sufficiently met.

In embodiments where the conductive device features are gate structures, the uniform width dimension can be a width chosen for portions of the gate structures formed over field regions. As discussed above, the uniform width dimension can be the same or different then the gate length.

Conventional gate structures, as shown in FIG. 4, include both portions of the gate formed over active regions 412, which have a width commonly referred to as "gate length", and portions of the gate formed over field regions 417, which are regions of the substrate other than the active regions. It is often the case in such conventional circuits that the portions of the gate structures formed over field regions 417 (not including contact pad regions 420, which are significantly wider than the adjacent portions of the gate structures formed over field regions) are formed to have a uniform width that can be somewhat wider than the gate length, although generally much less wider than contact pads 420. This uniform width dimension can be relatively constant throughout the length of the portion of any particular gate structure that is formed over a given field region, with the exception of a small transition region proximate the active region, where the width tapers down to the chosen gate length. However, this uniform width dimension can vary from one gate structure to another, depending on the type of gate structure (e.g., NMOS gate or PMOS gate).

In some embodiments, (referring again to FIG. 9) the gate structures of the present application can have a uniform width dimension "w" for substantially the entire length, $L_f$, formed over field region 917 between the active regions 912, including in the contact location. In some embodiments, "w" can be approximately the same as the gate length for the gate structures, wherein the phrase "approximately the same" is defined as above.

In an embodiment, the bent coverage regions can have a longitudinal center line "$s_2$" at the contact location that is bent so as not to lie upon the same longitudinal center line "$s_1$" as a major portion of the device feature, as shown in the case of 910e, wherein the bent coverage region 920e increases the coverage of the contact relative to coverage that would be achieved if the contact longitudinal center line at the contact location did lie upon the same longitudinal center line as a major portion of the device feature. The bent portion can be formed at an angle, $\phi$, from the center line "$s_1$", as shown in FIG. 9. Angle $\phi$ can be any suitable angle. Exemplary angles can range from about 5° to about 90°, such as 10°, 30° or 45°. In yet other embodiments, a gate, such as 910b, can be formed, where both edges of the gate are moved in the same direction at the coverage region 920b by a desired distance. In some embodiments, both edges can be moved substantially the same distance "$d_3$", which can be any suitable distance. For example, $d_3$ can have values of about 2 nm or more, such as about 5 nm to about 100 nm. These numbers are exemplary only, and numbers outside of these ranges can be used, as is the case for all example values provided herein. In yet other embodiments, the two edges of the coverage region 920b can be moved by different amounts.

The dimensions disclosed for $d_3$, as well as any other pattern dimensions disclosed herein unless otherwise expressly stated, are based upon the size of the pattern to be formed on the wafer. The actual dimensions for $d_3$ for the photomask patterns will vary depending upon the size of the reduction factor of the photomask. As discussed above, photomasks are often formed to have, for example, a 4× or 5× reduction factor, meaning that the photomask pattern dimensions can be about 4 or 5 times larger than the corresponding dimensions formed on the wafer. Similarly, the dimensions of the drawn pattern may or may not also have a reduction factor.

Therefore, as one of ordinary skill in the art would readily understand, the mask sizes and the drawn pattern sizes can correspond to the wafer dimensions based on any suitable reduction factor, including where the dimensions on the mask and/or drawn pattern dimensions are intended to be the same as those formed on the wafer.

The "critical dimension" is generally considered to be the minimum gate width being employed for a particular device. Devices formed by the methods of the present application can have any suitable critical dimensions. For example, the devices can have critical dimension of about 100 nm or less, such as, for example, about 45 nm, or about 32 nm, or less. The use of some minimal critical dimension object is common in the semiconductor industry for describing different generations of integrated circuits. The features of such integrated circuits generally approximately track or "scale with" these minimum features.

The concepts of the present application can generally be applied to any device for which connectivity can be made between various levels of the device, such as, for example, semiconductor devices. In some embodiments, the disclosure is contemplated for use in non-memory portions of a device, such as the logic or "random logic" portions of the device. The term "random logic" is defined herein to include all portions of the device with the exception of RAM memory portions (e.g., SRAM and DRAM), which RAM portions generally comprise small bit cells repeated a relatively large number of times. However, the processes can potentially be employed in any part of a device, including memory portions.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for fabricating a semiconductor device, the method comprising:
providing drawn pattern data describing first device features for forming gate structures having a first given minimum width over active regions and a second given minimum width over adjacent field regions, and second device features for gate contacts for respectively contacting the patterned gate structures;

generating initial gate mask patterns for the gate structures for forming target gate structures having the first given minimum width over both the active regions and the field regions, wherein the given minimum gate structure widths of at least a first plurality of the patterned targeted gate structures are too small to fully encompass the corresponding width dimension of the gate contacts at landing locations of the gate contacts with the target gate structures; and using computer code on a computer, automatically correcting the patterns to enlarge the widths of the initial gate mask patterns for the first plurality of the patterned targeted gate structures at the landing locations of the targeted gate structures, for forming retargeted gate structures to enable the contacts to be fully encompassed at the landing locations without elsewhere enlarging the widths of those patterned targeted gate structures.

2. The method of claim 1, further comprising using the corrected photomask patterns to form the patterned gate structures.

3. A method for fabricating a semiconductor device, the method comprising:

providing drawn pattern data describing first device features for forming conductive lines having a first given minimum width over active regions and a second given minimum width over adjacent field regions, and second device features for electrical contacts for respectively contacting the patterned conductive lines;

generating initial conductive line mask patterns for the conductive lines for forming target conductive lines having the first given minimum width over both the active regions and the field regions, wherein the given minimum conductive line widths of at least a first plurality of the patterned targeted conductive lines are too small to fully encompass the corresponding width dimension of the electrical contacts at landing locations of the electrical contacts with the target conductive lines; and using computer code on a computer, automatically correcting the patterns to enlarge the widths of the initial conductive line mask patterns for the first plurality of the patterned targeted conductive lines at the landing locations of the targeted conductive lines, for forming retargeted conductive lines to enable the contacts to be fully encompassed at the landing locations without elsewhere enlarging the widths of those patterned targeted conductive lines.

4. A method for fabricating a semiconductor device, the method comprising:

providing circuit layout data for drawn gate structures over active regions and over field regions including landing locations for gate contacts;

specifying a minimum gate length dimension for gate structures over the active regions specifying a minimum coverage width for gate contacts over the field regions;

generating initial gate mask patterns having longitudinal and lateral edges for forming the gate structures as elongated target gate structures without contact pads having the specified gate length dimension as a substantially uniform targeted width over both active regions and field regions;

using computer code run on a computer, automatically determining whether the uniform width of the target gate structure patterns of the initial gate mask patterns will provide the specified minimum coverage width for the gate contacts at the gate contact landing locations for the target gate structures; and using computer code run on a computer, automatically generating a modified gate mask patterns for forming the gate structures having target gate structure patterns determined to provide the specified minimum coverage width using the initial gate mask pattern edges as targeted gate structures, and for forming the gate structures having target gate structure patterns determined to not provide the specified minimum coverage width with retargeted gate structure patterns for forming retargeted gate structures with ones or more of the longitudinal or lateral edges shifted locally to provide the specified minimum coverage at gate contact landing locations.

5. The method of claim 4, further comprising forming the gate structures using the modified gate mask patterns.

6. The method of claim 5, wherein the computer code run on the computer for determining whether minimum coverage width will be provided and the computer code run on the computer for generating the modified gate mask patterns is integrated with computer code run on a computer for automatically correcting mask patterns for optical proximity correction.

7. The method of claim 4, wherein generating the modified mask patterns comprises providing retargeted gate structure patterns having ones or more of the longitudinal or lateral edges shifted at gate contact landing locations, to enable the gate contacts to be fully encompassed at the landing locations without elsewhere shifting the longitudinal or lateral edges of the targeted gate structure patterns.

8. The method of claim 7, wherein generating the modified mask patterns comprises providing at least one retargeted gate structure pattern having both longitudinal edges shifted at an associated gate contact landing location, to reposition the gate structure at the associated landing location to enable an associated gate contact to be fully encompassed at the associated landing location without elsewhere shifting the longitudinal edges of the targeted gate structure pattern.

9. The method of claim 7, wherein generating the modified mask patterns comprises providing at least one retargeted gate structure pattern having a lateral edge shifted to adjust a determined overhang of a gate contact at an associated gate contact landing location, to lengthen the gate structure.

10. The method of claim 4, wherein the specified minimum coverage width is a percentage of coverage that would be achieved if a contact where centered on the associated gate structure.

11. The method of claim 4, wherein the computer code run on the computer for determining whether minimum coverage width will be provided and the computer code run on the computer for generating the modified gate mask patterns is integrated with computer code run on a computer for automatically correcting mask patterns for optical proximity correction.

* * * * *